(12) United States Patent
Sumida et al.

(10) Patent No.: US 6,916,394 B2
(45) Date of Patent: Jul. 12, 2005

(54) CONNECTING MEMBER FOR CONNECTING CARRIER TAPES AND CARRIER TAPE CONNECTING METHOD USING THIS CONNECTING

(75) Inventors: Hiroto Sumida, Ikoma (JP); Kunio Tanaka, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 134 days.

(21) Appl. No.: 10/624,595

(22) Filed: Jul. 23, 2003

(65) Prior Publication Data
US 2004/0011701 A1 Jan. 22, 2004

Related U.S. Application Data

(62) Division of application No. 09/973,878, filed on Oct. 11, 2001.

(30) Foreign Application Priority Data

Oct. 11, 2000 (JP) .................................. 2000-310420
Aug. 9, 2001 (JP) .................................. 2001-242876

(51) Int. Cl.$^7$ .................. B65H 69/02; B41M 3/12; B29C 65/00; B32B 9/00; B32B 3/12

(52) U.S. Cl. .................. 156/157; 156/159; 156/230; 156/235; 156/247; 156/289; 156/304.5; 156/505; 427/40.1; 427/41.8; 427/42.3; 427/352; 427/354; 427/914

(58) Field of Search .................. 156/157, 159, 156/230, 234, 235, 238, 240, 247, 289, 291, 295, 304.1, 304.5, 306.6, 505, 506; 428/40.1, 41.6, 41.7, 418, 42.1, 42.2, 42.3, 343, 352, 354, 194, 202, 200, 220, 914

(56) References Cited

U.S. PATENT DOCUMENTS

| | | | | |
|---|---|---|---|---|
| 2,969,106 A | * | 1/1961 | Reibel et al. | 156/157 |
| 2,994,362 A | * | 8/1961 | Hall | 156/505 |
| 3,475,263 A | * | 10/1969 | Kapilow et al. | 156/157 |
| 3,733,240 A | * | 5/1973 | Hanke | 428/42.2 |
| 4,041,201 A | * | 8/1977 | Wurker | 156/157 |
| 4,146,661 A | * | 3/1979 | Grandel et al. | 156/157 |
| 4,247,582 A | * | 1/1981 | Hanke | 428/43 |
| 5,429,580 A | * | 7/1995 | Diaz | 493/374 |
| 5,643,401 A | * | 7/1997 | Schulze-Kahlayss et al. | 156/505 |
| 6,428,888 B1 | * | 8/2002 | Kato | 156/157 |
| D478,880 S | * | 8/2003 | Sumida | D13/199 |

FOREIGN PATENT DOCUMENTS

| | | | | |
|---|---|---|---|---|
| EP | 0613339 | | 8/1994 | |
| JP | 2000-38242 | * | 2/2000 | B65H/21/00 |
| JP | 2000-124665 | * | 4/2000 | H05K/13/02 |

OTHER PUBLICATIONS

"Device for Splicing surface mount technology (SMT) tape" Research Disclosure, Kenneth Mason Publications, No. 429, Jan. 2000, p. 123.
International Search Report Oct. 7, 2003.

* cited by examiner

Primary Examiner—J. A. Lorengo
(74) Attorney, Agent, or Firm—Connolly Bove Lodge & Hutz LLP

(57) ABSTRACT

A connecting member, used for serially connecting two carrier tapes, comprises a base film, a belt-like reference band substantially fixed on the base film, a bonding tape adhering on the base film, and a cover film covering the bonding tape. A straight reference face is provided on a longitudinal side of the reference band closely to the bonding tape.

13 Claims, 11 Drawing Sheets

CONNECTING MEMBER FOR CONNECTING CARRIER TAPES AND CARRIER TAPE CONNECTING METHOD USING THIS CONNECTING This application is a divisional of U.S. patent application Ser. No. 09/973,878, filed Oct. 11, 2001, pending.

BACKGROUND OF THE INVENTION

This invention relates to a connecting member for connecting carrier tapes used in a parts mounting apparatus, and also relates to a carrier tape connecting method using this connecting member.

In a parts mounting apparatus, parts are carried on a carrier tape extending from a reel and conveyed one after another to the parts mounting apparatus. When arrived at the parts mounting apparatus, parts are mounted on corresponding substrates successively. The carrier tape can carry numerous parts serially arrayed in the longitudinal direction and is preferably used to continuously feed many parts to the parts mounting apparatus. The productivity of the parts mounting apparatus can be improved.

However, during an operation of the parts mounting apparatus, a worker is required to connect a succeeding carrier tape to a preceding carrier tape every time when a trailing edge of the preceding carrier tape approaches the parts mounting apparatus. This assures the continuous supply of parts to the mounting apparatus for a long time without interrupting the operation of the mounting apparatus. More specifically, the worker needs to connect a leading edge of the succeeding carrier tape to the trailing edge of the preceding carrier tape. In connecting two carrier tapes, the worker usually positions the leading edge of the succeeding carrier tape so as to follow after the trailing edge of the preceding carrier tape. Then, the worker fixedly connects the serially arrayed carrier tapes with a bonding tape. However, according to this connecting method, workability is very bad. For example, in the beginning, the worker's left hand holds the trailing edge of the preceding carrier tape and the worker's right hand puts an end of a bonding tape on the trailing edge of the preceding carrier tape. In the next moment, the worker's right hand holds the leading edge of the succeeding carrier tape and positions it so as to follow after the trailing edge of the preceding carrier tape, while the worker's left hand holds the one end of bonding tape together with the trailing edge of the preceding carrier tape. Then, the worker spreads the bonding tape so as to span from the trailing edge of the preceding carrier tape to the leading edge of the succeeding carrier tape, thereby serially connecting two carrier tapes.

However, the above-described conventional connecting method is not easy for the workers if not well trained because of the difficulty in connecting two carrier tapes without causing any dislocation or inclination at their connecting portion.

SUMMARY OF THE INVENTION

In view of the foregoing problems, the present invention has an object to provide a technique for easily connecting two carrier tapes at their trailing and leading edges.

To accomplish the above and other related objects, the present invention provides a connecting member used for serially connecting two carrier tapes, comprising a base film, a belt-like reference band substantially fixed on the base film, a bonding tape adhering on the base film, and a cover film covering the bonding tape, wherein a straight reference face is provided on a longitudinal side of the reference band closely to the bonding tape. According to the connecting member of this invention, a worker can align a first carrier tape and a second carrier tape serially along the reference face of the reference band, and connects leading and trailing edges of the first and second carrier tapes with the bonding tape. Thus, it becomes possible to easily perform the connecting operation without causing any dislocation or inclination between the first and second carrier tapes.

According to a preferable embodiment of the present invention, the base film is configured into a rectangular shape, and the reference band is positioned in parallel with one side of the base film. This arrangement facilitates the manufacturing of connecting members because each connecting member can be easily obtained by cutting band-like united materials at predetermined intervals.

According to the preferable embodiment of the present invention, the color of the reference band is different from that of the base film. This makes it easy to clearly discriminate the reference band from the base film. The worker can easily align the first and second carrier tapes along the reference face of the reference band. The connecting operation can be simplified.

According to the preferable embodiment of the present invention, the base film is transparent. Using the transparent base film is effective in visually confirming the connecting condition between leading and trailing edges of the first and second carrier tapes or visually confirming the bonding condition between these carrier tapes and bonding tapes. Thus, the worker can surely and correctly connect the first and second carrier tapes.

According to the preferable embodiment of the present invention, the color of the reference band is selected from the group consisting of black, red, blue, yellow, green, and white. This brings an effect of facilitating the connecting operation.

According to the preferable embodiment of the present invention, the reference band is thicker than the cover film. The position of the reference band can be immediately recognized when the worker holds the connecting member. Thus, the worker can easily grip the reference band and smoothly peel off the cover film. The workability can be improved.

According to the preferable embodiment of the present invention, a plurality of feed hole marks are provided between the reference band and the bonding tape on the base film, and the feed hole marks are arrayed at predetermined intervals so as to agree with feed holes of each carrier tape. The worker can accurately connect the first and second carrier tapes by adjusting the feed holes thereof at the connecting portion.

According to the preferable embodiment of the present invention, an edge mark is provided at a longitudinal center of the base film to indicate a portion corresponding to a cut face of each carrier tape. The worker can easily perform the connecting operation of the first and second carrier tapes with reference to this edge mark. Namely, the worker can easily identify a correct position (i.e., the longitudinal center of the base film) for connecting the first and second carrier tapes. The connecting operation can be performed adequately.

According to the preferable embodiment of the present invention, a folding line is provided between two bonding tapes on the base film, and the folding line is parallel to the reference face of the reference band. With this embodiment, it becomes possible to connect the upper surfaces of the first and second carrier tapes with a second bonding tape by folding the base film along the folding line under a condition where the bottom surfaces of the first and second carrier tapes are connected with a first bonding tape. Namely, it becomes possible to firmly connect the first and second carrier tapes with two bonding taped adhering on the upper and lower surfaces thereof.

According to the preferable embodiment of the present invention, the base film is configured into a rectangular shape, and a distance from the folding line to the reference face of reference band located near one side of the base film is longer than a distance from the folding line to an opposite side of the base film. According to this arrangement, when the base film is folded along the folding line, the folded part of the base film does not overlap with the reference band. Thus, the worker can firmly depress the second bonding tape to the first and second carrier tapes, thereby ensuring the bonding of the second bonding tape to the first and second carrier tapes.

According to the preferable embodiment of the present invention, a predetermined gap is provided between the reference band and one side of the base film. According to this arrangement, the gap gives a marginal space for allowing excessive adhesive to leak from the underneath of the reference band without overflowing the base film when the reference band is bonded on the upper surface of the base film. Thus, the worker can apply a sufficient amount of adhesive onto the designated surface area of the base film beforehand without hesitating failure in application of adhesive. Bonding of the reference band to the base film can be ensured.

According to the preferable embodiment of the present invention, the cove film overhangs from an opposite side of the base film far from the reference band. This allows the worker to pick the protruding edge of the cover film so that the cover film can be easily peeled off the base film.

According to the preferable embodiment of the present invention, the base film and the bonding tape have the same size in a longitudinal direction of the reference band. This arrangement facilitates the manufacturing of connecting members because each connecting member can be easily obtained by cutting band-like united materials at predetermined intervals.

According to the preferable embodiment of the present invention, the base film and the reference band have the same size in a longitudinal direction of the reference band. This arrangement facilitates the manufacturing of connecting members because each connecting member can be easily obtained by cutting band-like united materials at predetermined intervals.

According to the preferable embodiment of the present invention, the base film has a size not shorter than 20 mm in a longitudinal direction of the reference band. The base film having a longitudinal size not shorter than 20 mm allows the worker to securely hold the base film and the first and second carrier tapes firmly by right and left hands. Workability in connecting two carrier tapes can be improved.

According to the preferable embodiment of the present invention, the bonding tape has a size not longer than 80 mm in a longitudinal direction of the reference band. Restricting a longitudinal size of the bonding tape is effective to facilitate the connecting operation. If the length of the boding tape is excessively long, the worker will feel difficulty in correctly connecting the terminal edge of the first carrier tape to the leading edge of the second carrier tape. However, 80 mm or less is an adequate length for the worker to hold two carrier tapes straight at the connecting portion during the connecting operation. The connecting operation can be stabilized.

According to the preferable embodiment of the present invention, a plurality of carrying holes are provided on the carrier tape for accommodating parts, a top tape covers the carrying holes, and a transverse width of the bonding tape is narrower than that of the top tape. When the trailing edge of the first carrier tape is connected to the leading edge of the second carrier tape, the bonding tape is not bonded to a region other than the top tape. Thus, the worker can smoothly peel off the top tape when the parts are fed to a part mounting apparatus.

According to the preferable embodiment of the present invention, the transverse width of the bonding tape is not larger than 90% of the transverse width of the top tape. This makes it possible to surely prevent the bonding tape from adhering on a region other than the top tape even when the carrier tape and its top tape are deformed in a zigzag fashion with respect to the longitudinal axis.

According to the preferable embodiment of the present invention, the color of the bonding tape is different from that of the carrier tape or its top tape. The worker can easily find the connecting portion after the carrier tapes are connected.

According to the preferable embodiment of the present invention, the bonding tape is semitransparent. This makes it possible for the worker to easily find the connecting portion after the carrier tapes are connected and also to surely confirm the presence of each part accommodated in a carrying hole.

According to the preferable embodiment of the present invention, the bonding tape is transparent. The worker can surely confirm the presence of each part accommodated in a carrying hole.

The present invention provides a first carrier tape connecting method using the connecting member of the present invention, comprising a step of peeling the cover film off the base film, a step of positioning an edge portion of a first carrier tape on the base film in such a manner that the first carrier tape is brought into contact with the reference band along the reference face, a step of bonding the edge portion of the first carrier tape to the bonding tape, a step of positioning an edge portion of a second carrier tape on the base film in such a manner that the second carrier tape is brought into contact with the reference band along the reference face and is also brought into contact with the first carrier tape along their edge portions, a step of bonding the edge portion of the second carrier tape to the bonding tape, and a step of removing an assembly of the first and second carrier tapes serially connected by the bonding tape from the base film. The first carrier tape connecting method of the present invention makes it possible to adequately connect the trailing edge of the first carrier tape to the leading edge of the second carrier tape.

The present invention provides a second carrier tape connecting method using the connecting member of the present invention, comprising a step of peeling the cover film off the base film, a step of positioning an edge portion of a first carrier tape on the base film in such a manner that the first carrier tape is brought into contact with the reference band along the reference face and also the position of feed holes of the first carrier tape agrees with the feed hole marks of the base film, a step of bonding the edge portion of the first carrier tape to the bonding tape, a step of positioning an edge portion of a second carrier tape on the base film in such a manner that the second carrier tape is brought into contact with the reference band along the reference face and is also brought into contact with the first carrier tape along their edge portions, a step of bonding the edge portion of the second carrier tape to the bonding tape, and a step of removing an assembly of the first and second carrier tapes serially connected by the bonding tape from the base film. The second carrier tape connecting method of the present invention makes it possible to adequately connect the trailing edge of the first carrier tape to the leading edge of the second carrier tape.

The present invention provides a third carrier tape connecting method using the connecting member of the present invention, comprising a step of peeling the cover film off the base film, a step of positioning an edge portion of a first carrier tape on the base film in such a manner that the first carrier tape is brought into contact with the reference band along the reference face and also the position of the edge portion of the first carrier tape agrees with the edge mark of the base film, a step of bonding the edge portion of the first carrier tape to the bonding tape, a step of positioning an edge portion of a second carrier tape on the base film in such a manner that the second carrier tape is brought into contact with the reference band along the reference face and is also brought into contact with the first carrier tape along their edge portions, a step of bonding the edge portion of the second carrier tape to the bonding tape, and a step of removing an assembly of the first and second carrier tapes serially connected by the bonding tape from the base film. The third carrier tape connecting method of the present invention makes it possible to adequately connect the trailing edge of the first carrier tape to the leading edge of the second carrier tape.

According to the preferable embodiment of the present invention, each of the first and second carrier tapes has a plurality of carrying holes for accommodating parts and a top tape covering the carrying holes, and the edge portions of the first and second carrier tapes are connected to the bonding tape via the top tape. The worker can continuously and steadily peel off the top tape at the connecting portion of the first and second carrier tapes. Parts supply to the mounting apparatus becomes stable.

The present invention provides a fourth carrier tape connecting method using the connecting member of the present invention, comprising a step of peeling the cover film off the base film, a step of positioning an edge portion of a first carrier tape on the base film in such a manner that the first carrier tape is brought into contact with the reference band along the reference face, a step of bonding one surface of the edge portion of the first carrier tape to a first bonding tape located between the folding line and the reference band, a step of positioning an edge portion of a second carrier tape on the base film in such a manner that the second carrier tape is brought into contact with the reference band along the reference face and is also brought into contact with the first carrier tape along their edge portions, a step of bonding one surface of the edge portion of the second carrier tape to the first bonding tape, a step of folding the base film along the folding line so that a second bonding tape located between the folding line and the other end of the base film is adhered on opposite surfaces of the edge portions of the first and second carrier tapes, and a step of removing an assembly of the first and second carrier tapes serially connected by the first and second bonding tapes from the base film. The fourth carrier tape connecting method of the present invention makes it possible to adequately connect the trailing edge of the first carrier tape to the leading edge of the second carrier tape.

According to the preferable embodiment of the present invention, each of the first and second carrier tapes has a plurality of carrying holes for accommodating parts and a top tape covering the carrying holes, and the edge portions of the first and second carrier tapes are first connected to the first bonding tape via the top tape and then connected to the second bonding tape. During the connecting operation, after the carrier tapes are positioned, the worker can first connect the carrier tapes at the surface on which the top tape is provided. Thus, the connection of the top tape can be accurately performed. Firm and reliable connection is assured by connecting the carrier tapes at both of opposite surfaces.

According to the preferable embodiment of the present invention, the edge portions of the first and second carrier tapes are cut beforehand into convex and concave shapes just fitting to each other before the edge portions of the first and second carrier tapes are connected with the connecting member. As the edge portions of the first and second carrier tapes are configured into mutually mating convex and concave shapes, the worker can easily connect the first and second carrier tapes at their connecting portion without causing any dislocation or inclination.

According to the preferable embodiment of the present invention, the edge portions of the first and second carrier tapes are cut into wavy shapes just fitting to each other before the edge portions of the first and second carrier tapes are connected with the connecting member. As the edge portions of the first and second carrier tapes are configured into mutually mating wavy shapes, the worker can easily connect the first and second carrier tapes at their connecting portion without causing any dislocation or inclination.

According to the preferable embodiment of the present invention, the edge portions of the first and second carrier tapes are cut with a cutting tool having cutting blades corresponding to the convex and concave shapes or the wavy shapes. Using such a cutting tool makes it possible to improve the workability in cutting the first and second carrier tapes into the convex and concave shapes or into the wavy shapes.

According to the preferable embodiment of the present invention, positioning pins, engageable with the feed holes of the carrier tapes, are provided on one cutting blade of the cutting tool. This arrangement makes it possible to stabilize the cutting position with respect to the feed holes of the first and second carrier tapes. No feed hole pitch dislocation is caused at the connecting portion of the first and second carrier tapes.

According to the preferable embodiment of the present invention, each of the first and second carrier tapes has a plurality of carrying holes for accommodating parts and a top tape covering the carrying holes, and the top tape is cut into convex and concave shapes or into wavy shapes at the edge portions of the carrier tapes. This effectively prevents a very thin top tape from wrinkling or breaking at its cut edge. The connecting operation of the carrier tapes can be stabilized.

According to the preferable embodiment of the present invention, the top tape provided on a leading edge of a downstream carrier tape is cut into a convex or mount shape protruding toward a trailing edge of an upstream carrier tape. This arrangement makes it possible for the worker to smoothly peel the top tape.

According to the preferable embodiment of the present invention, the convex or mount shape has a pinnacle at substantially the center of the top tape provided on the leading edge of the downstream carrier tape. As the center region of the top tape is not adhered on the base film of the carrier tape, the worker can easily pull up the center region and can smoothly start peeling off the top tape.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF PREFERRED EMBODIMENTS

Hereinafter, preferred embodiments of the present invention will be explained with reference to attached drawings.

Figure 1:
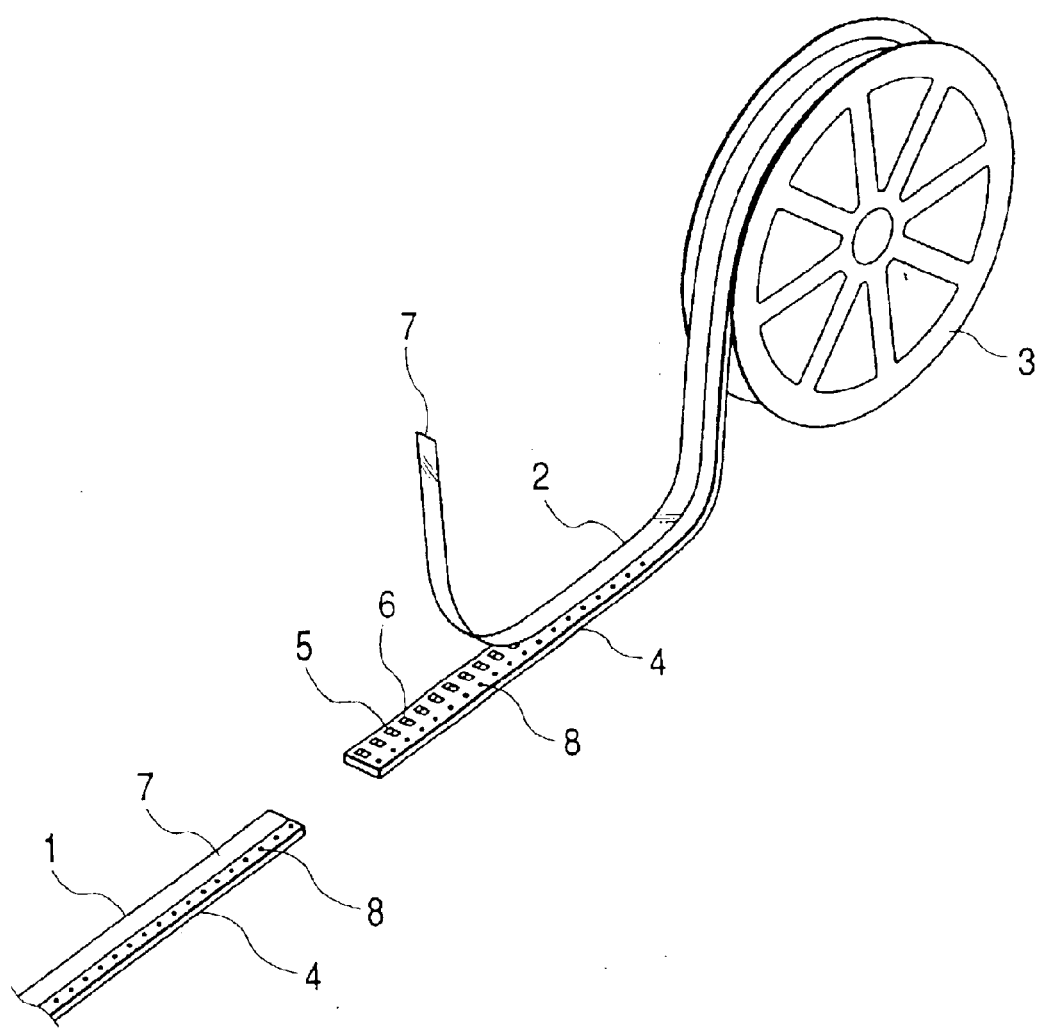
FIG. 1 is a perspective view showing first and second carrier tapes to be connected by a connecting member in accordance with a preferable embodiment of the present invention.

FIG. 1 shows a first carrier tape 1 whose trailing edge appears during a mounting operation of parts performed by feeding the first carrier tape 1 to a parts mounting apparatus. A second carrier tape 2 is wound in a reel 3. When connected to the trailing edge of the first carrier tape 1, a leading edge of the second carrier tape 2 follows after the first carrier tape 1 and advances together with the first carrier tape 1 toward the parts mounting apparatus. Namely, the first carrier tape 1 is positioned at the upstream side on a tape feeding path, while the second carrier tape 2 is positioned at the downstream side. Details of a connecting operation of the first carrier tape 1 and the second carrier tape 2 will be described later. The following should be explained beforehand based on FIG. 1.

Each of the first carrier tape 1 and the second carrier tape 2, referred to as a square hole punch carrier type taping, includes a white or black base film 4 that is made of paper or plastic and provided with a plurality of carrying holes 5 successively provided at predetermined intervals thereon. Each carrying hole 5 is configured into a square shape for accommodating a part 6. A top tape 7, having an extremely thin width of 50 $\mu$m to 80 $\mu$m, covers the successively arranged carrying holes 5 so as to provide a flattened surface on the first carrier tape 1. The top tape 7, made of a transparent polyester, has both ends extending in the longitudinal direction thereof and adhered onto the base film 4 by appropriate adhesive.

A plurality of feed holes 8, successively arrayed at predetermined intervals, are provided on the base film 4 and not covered by the top tape 7. The bottom of each carrying hole 5 is closed. When the parts 6 carried on these carrier tapes 1 and 2 are supplied to the parts mounting apparatus, a worker or operator peels the top tape 7 off the base film 4 beforehand. Then, the naked parts 6, accommodated in the carrying holes 5, are successively supplied to the parts mounting apparatus.

Hereinafter, the operation for connecting the trailing edge of the first carrier tape 1 to the leading edge of the second carrier tape 2 will be explained with reference to FIG. 2 and the following drawings.

Figure 2:
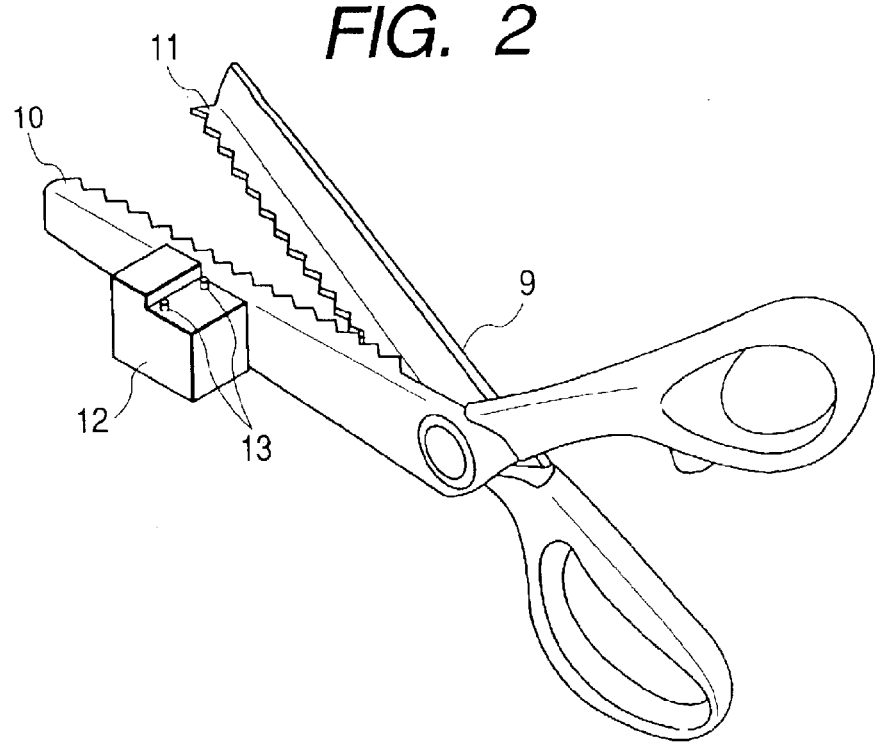
FIG. 2 is a perspective view showing a cutting tool used in the connecting operation of carrier tapes in accordance with the preferable embodiment of the present invention.
Figure 3:
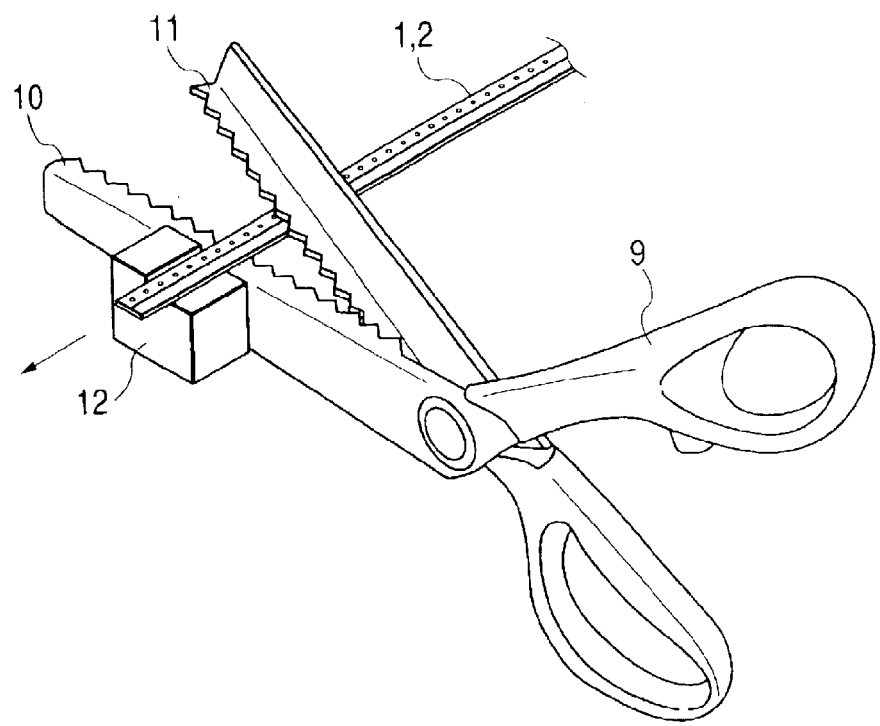
FIG. 3 is a perspective view showing a cutting operation of carrier tapes in accordance with the preferable embodiment of the present invention.

FIG. 2 shows a cutting tool 9, such as scissors, with wavy cutting blades 10 and 11 used for cutting the edges of the first carrier tape 1 and the second carrier tape 2. A base 12, with positioning pins 13 provided on an upper surface thereof, is attached to a side face of one cutting blade 10. Two positioning pins 13, serving as engaging projections, are spaced at a predetermined pitch identical with the pitch of the feed holes 8 shown in FIG. 1. As shown in FIG. 3, the feed holes 8 of the first carrier tape 1 and the second carrier tape 2 engage with the positioning pins 13 so that the first carrier tape 1 is overlapped on the second carrier tape 2 or vice versa. Under this condition, the overlapped carrier tapes 1 and 2 are cut by the cutting blades 10 and 11. In this case, the trailing edge of the first carrier tape 1 is directed toward an arrow shown in FIG. 3. On the contrary, the leading edge of the second carrier tape 2 is directed to the opposite direction.

In this manner, using the wavy cutting blades 10 and 11 of the cutting tool 9 improves the workability of the cutting operation of the carrier tapes 1 and 2. Furthermore, the engaging projections of the cutting 9 securely fix the first carrier tape 1 and the second carrier tape 2 during the cutting operation. The cut position of respective carrier tapes 1 and 2 is always constant with respect to the feed holes 8. This makes it possible to prevent the feed holes 8 of the first and second carrier tapes 1 and 2 from dislocating from each other in the later-described connecting operation.

Figure 4A:
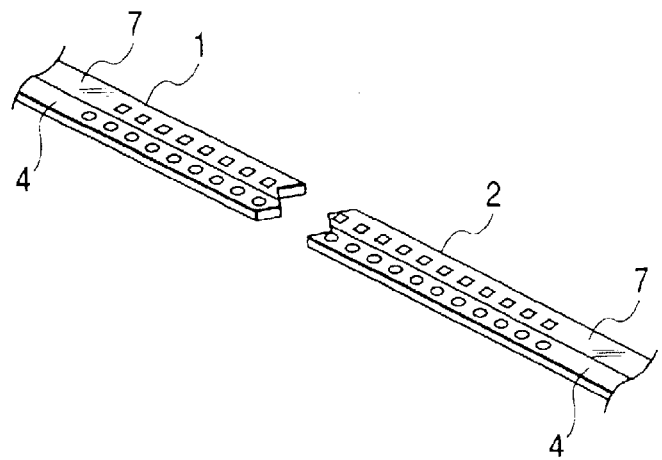
FIG. 4A is a perspective view showing a separated condition of the first and second carrier tapes obtained through the cutting operation of carrier tapes in accordance with the preferable embodiment of the present invention.
Figure 4B:
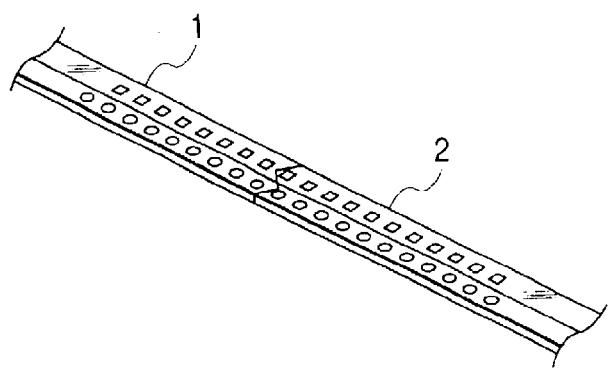
FIG. 4B is a perspective view showing a connected condition of the first and second carrier tapes obtained through the cutting operation of carrier tapes in accordance with the preferable embodiment of the present invention.
Figure 5:
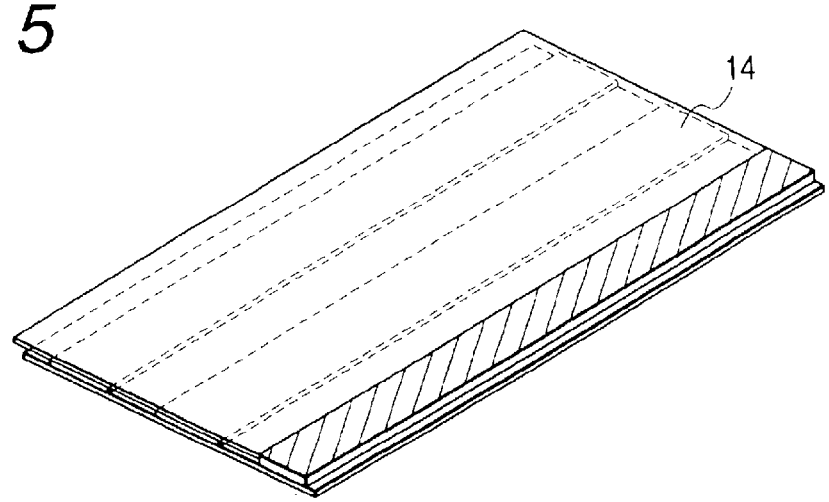
FIG. 5 is a perspective view showing a connecting member in accordance with the preferable embodiment of the present invention.
Figure 6:
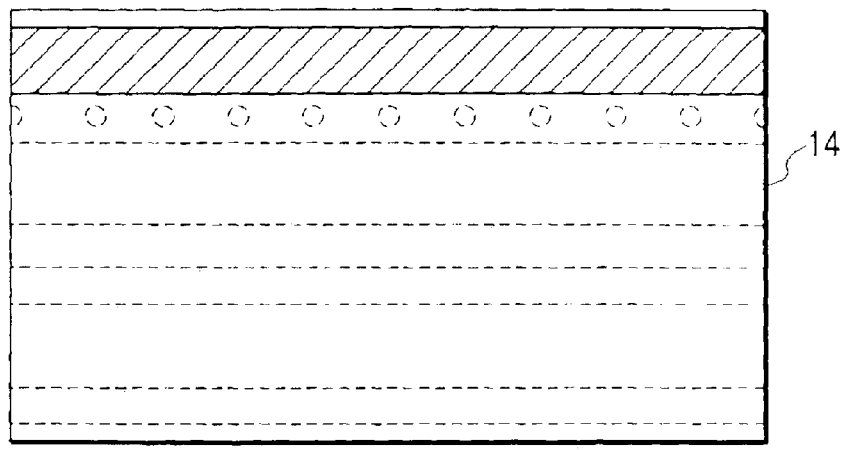
FIG. 6 is a plan view showing the connecting member in accordance with the preferable embodiment of the present invention.

FIGS. 4A and 4B shows the cut edges of the first and second carrier tapes 1 and 2. The cut shape of the trailing and leading edges of first and second carrier tapes 1 and 2 is identical with the wavy shape of the cutting tool 9. As described above, each position of the first and second carrier tapes 1 and 2 is accurately regulated by the positioning pins 13. Furthermore, the cutting direction is fixed with respect to each of the first and second carrier tapes 1 and 2. Thus, as shown in FIG. 4A, the trailing edge of first carrier tape 1 and the leading edge of second carrier tape 2 have the same cut shape. Therefore, as shown in FIG. 4B, the first carrier tape 1 completely match with the second carrier tape 2 when assembled along the cut edges thereof. In other words, no dislocation is present between the first and second carrier tapes 1 and 3 in a direction normal to their longitudinal directions.

FIGS. 5 to 8 show a connecting member 14 that is used for connecting the trailing edge of first carrier tape 1 and the leading edge of second carrier tape 2 after finishing the above-described cutting operation. The connecting member 14, as specifically shown in FIG. 8, comprises a rectangular base film 15, a reference band 16, a first bonding tape 17, a second bonding tape 18, and a cover film 19. The base film 15 is 40 mm in the longitudinal direction and 26 mm in a direction normal to the longitudinal direction. The reference band 16 extends in the longitudinal direction along one side of the base film 15. The first bonding tape 17 is parallel to the reference band 16 with a predetermined clearance provided therebetween. The second bonding tape 18 is parallel to the first bonding tape 17 with a predetermined clearance provided therebetween. The cover film 19 covers both of the first bonding tape 17 and the second bonding tape 18.

The bonding tapes 17 and 18 are adhered on an upper surface of the base film 15 via a weak adhesive layer coated on the upper surface of base film 15. Each of the bonding tapes 17 and 18 has an upper surface serving as a strong adhesive layer. The cover film 19 has a lower surface, facing to the bonding tapes 17 and 18, that is finished as an easily removable surface. The reference band 16 is fixed to the upper surface of base film 15 via a strong adhesive layer. The reference band 16 has a reference face 16a extending straight along its longitudinal side closely to the first bonding tape 17. A plurality of feed hole marks 21, arrayed at predetermined intervals, are provided between the reference band 16 and the first bonding tape 17 on the base film 15. The interval (or pitch) of feed hole marks 21 is identical with that of the feed holes 8 of first and second carrier tapes 1 and 2. Furthermore, a folding line 20 is provided between the first bonding tape 17 and the second bonding tape 18 on the base film 15. The folding line 20 is parallel to the reference face 16a of the reference band 16.

Figure 9:
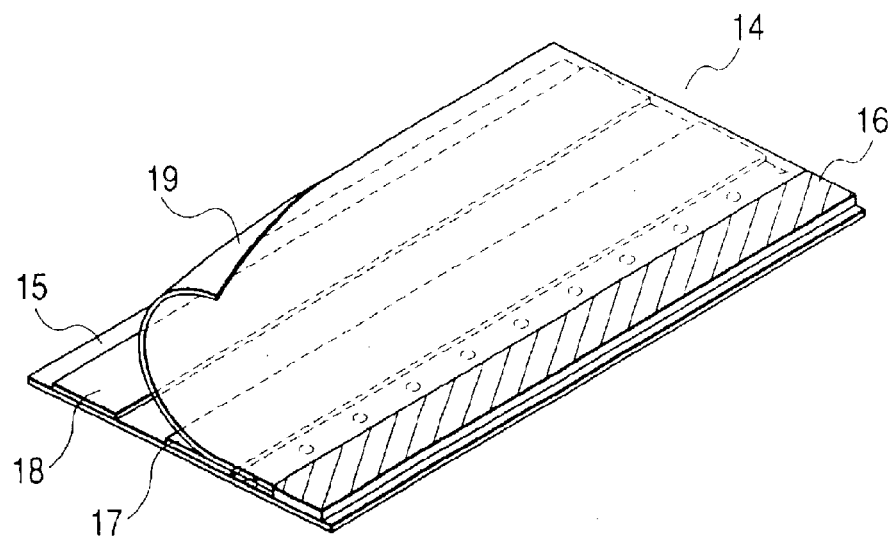
FIG. 9 is a perspective view showing the connecting member in an earlier stage of a carrier tape connecting method in accordance with the preferable embodiment of the present invention.
Figure 10:
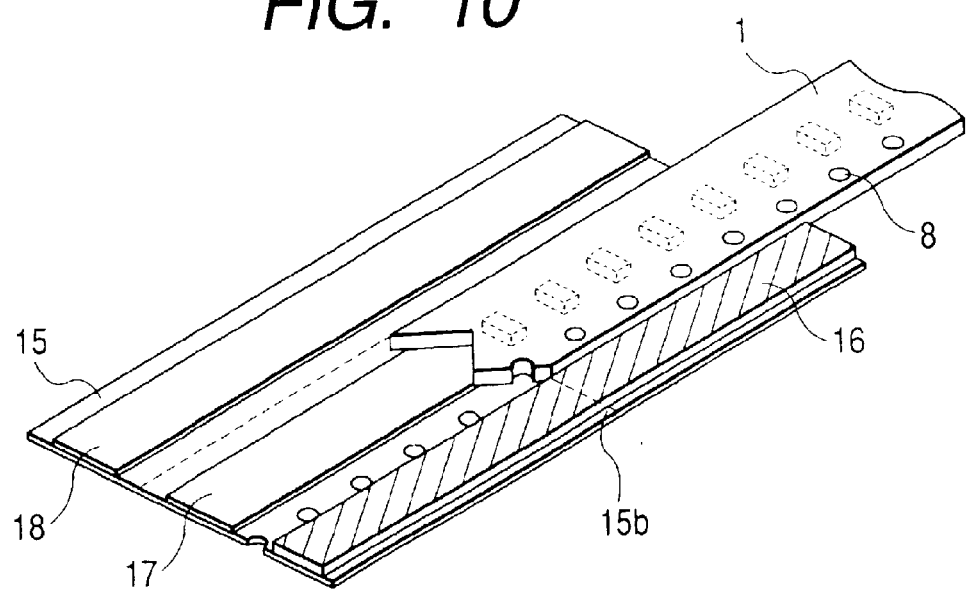
FIG. 10 is a perspective view showing the connecting member in a succeeding stage of the carrier tape connecting method in accordance with the preferable embodiment of the present invention.

First, to connect the first carrier tape 1 and the second carrier tape 2 shown in FIGS. 4A and 4B, the worker peels the cover film 19 off the upper surface of the base film 15 as shown in FIG. 9. As the lower surface of cover film 19 is easily removable type, the cover film 19 can be smoothly removed off while the first and second bonding tapes 17 and 18 firmly adhere and remains on the upper surface of the base film 15. In this condition, as shown in FIG. 10, the worker places the terminal end of the first carrier tape 1 on the first bonding tape 17 so that one longitudinal side of the first carrier tape 1 is brought into contact with the reference band 16 along the reference face 16a. Then, the worker adjusts the position of the first carrier tape 1 in the longitudinal direction so that the feed holes 8 agree with the feed hole marks 21. After finishing the adjustment of first carrier tape 1, the worker finalizes the position of first carrier tape 1 and firmly adheres the first carrier tape 1 on the first bonding tape 17. In this case, the worker adjusts direction of the first carrier tape 1 in such a manner that one side of the terminal edge covered by the top tape 7 is faced down and bonded first on the first bonding tape 17.

Figure 11:
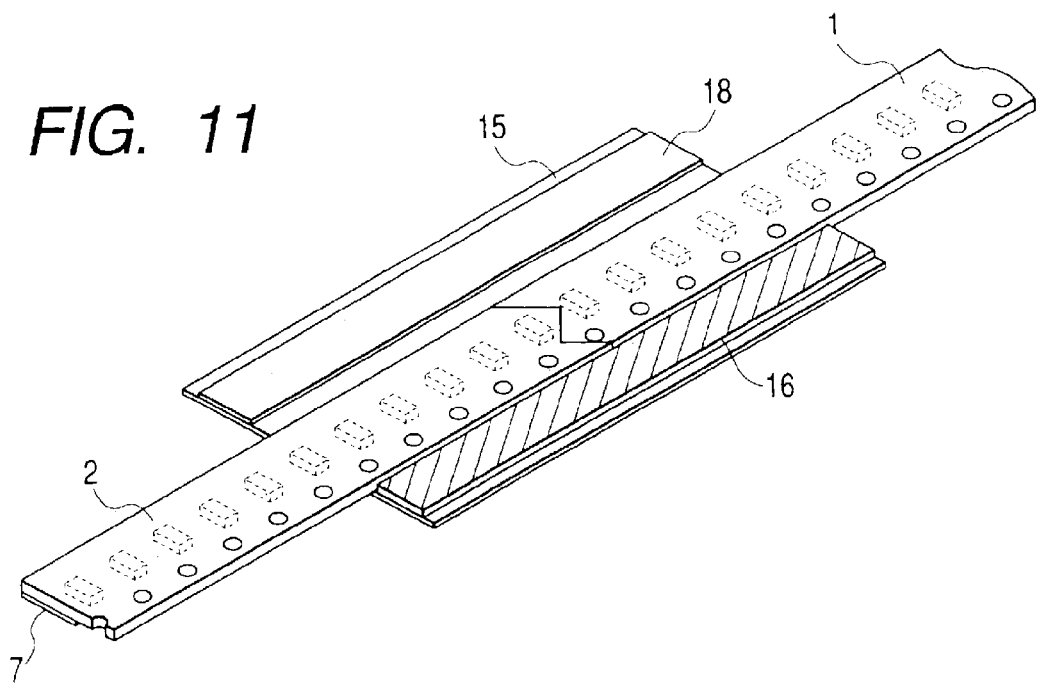
FIG. 11 is a perspective view showing the connecting member in another succeeding stage of the carrier tape connecting method in accordance with the preferable embodiment of the present invention.

From this condition, the worker places the second carrier tape 2 along the reference face 16a of reference band 16 so that the leading edge of second carrier 2 just follows the trailing edge of first carrier tape 1 as shown in FIG. 11. The wavy cut edge of the second carrier tape 2 just fits to the wavy cut edge of the first carrier tape 1. In this case, the worker adjust the direction of the second carrier tape 2 in such a manner that one side of the leading edge covered by the top tape 7 is faced down and bonded first on the first bonding tape 17.

Figure 12:
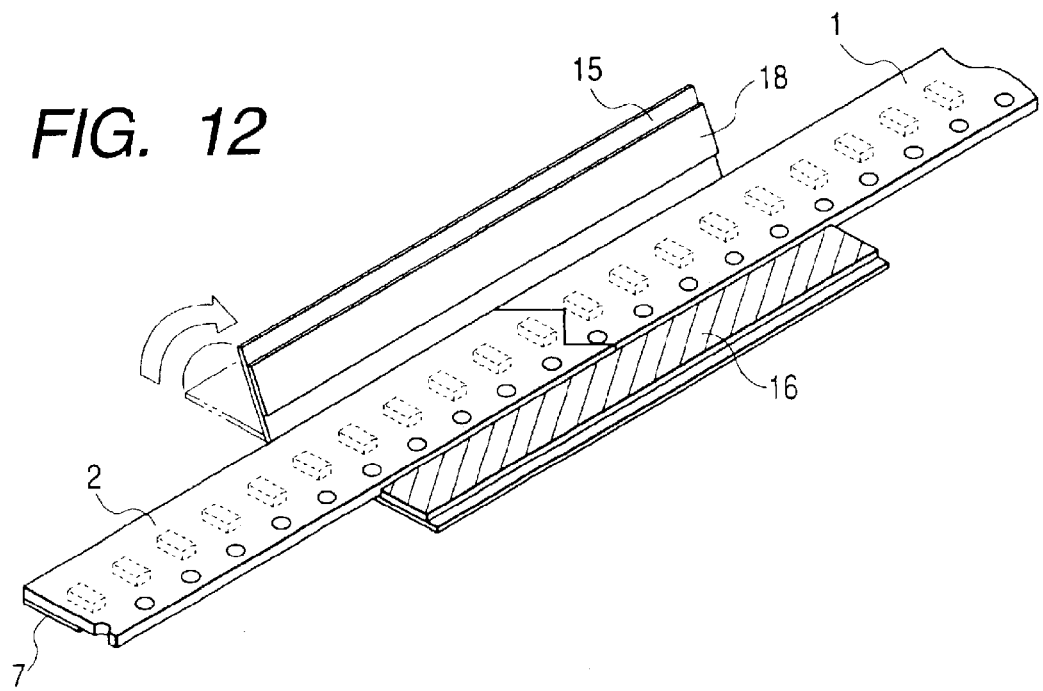
FIG. 12 is a perspective view showing the connecting member in another succeeding stage of the carrier tape connecting method in accordance with the preferable embodiment of the present invention.
Figure 13:
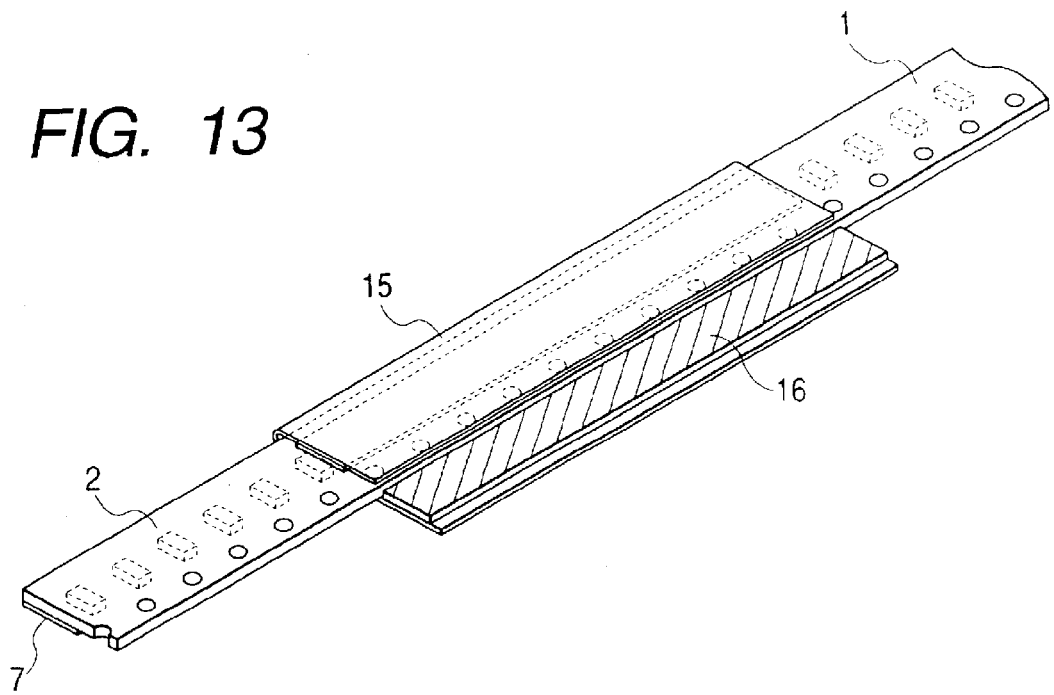
FIG. 13 is a perspective view showing the connecting member in another succeeding stage of the carrier tape connecting method in accordance with the preferable embodiment of the present invention.
Figure 14:
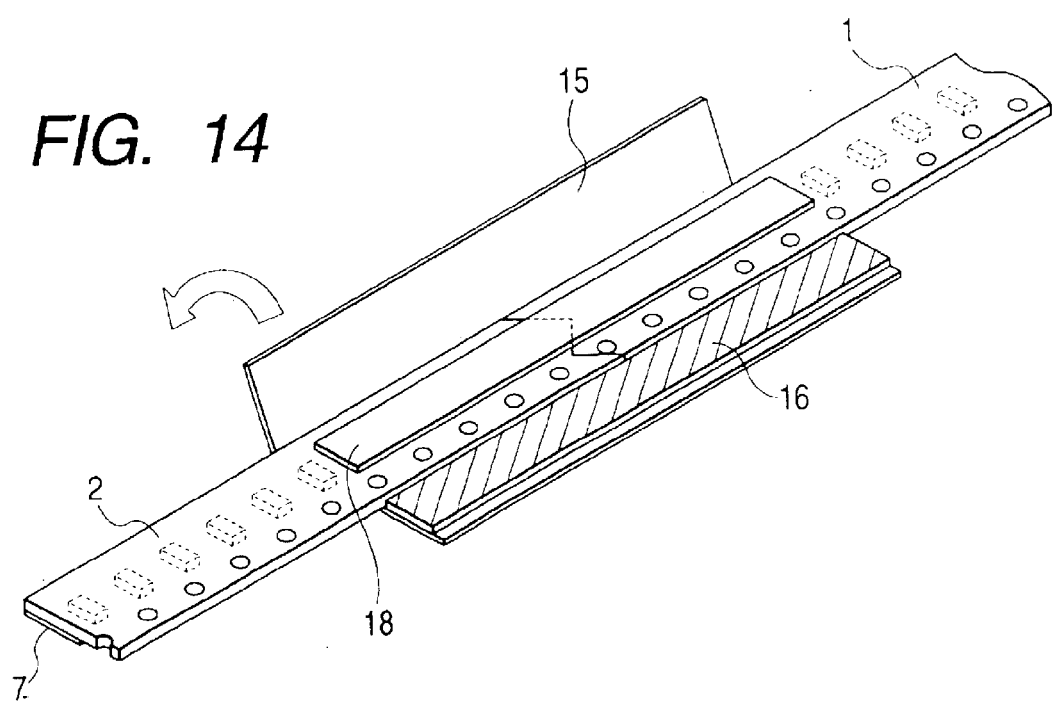
FIG. 14 is a perspective view showing the connecting member in another succeeding stage of the carrier tape connecting method in accordance with the preferable embodiment of the present invention.
Figure 15:
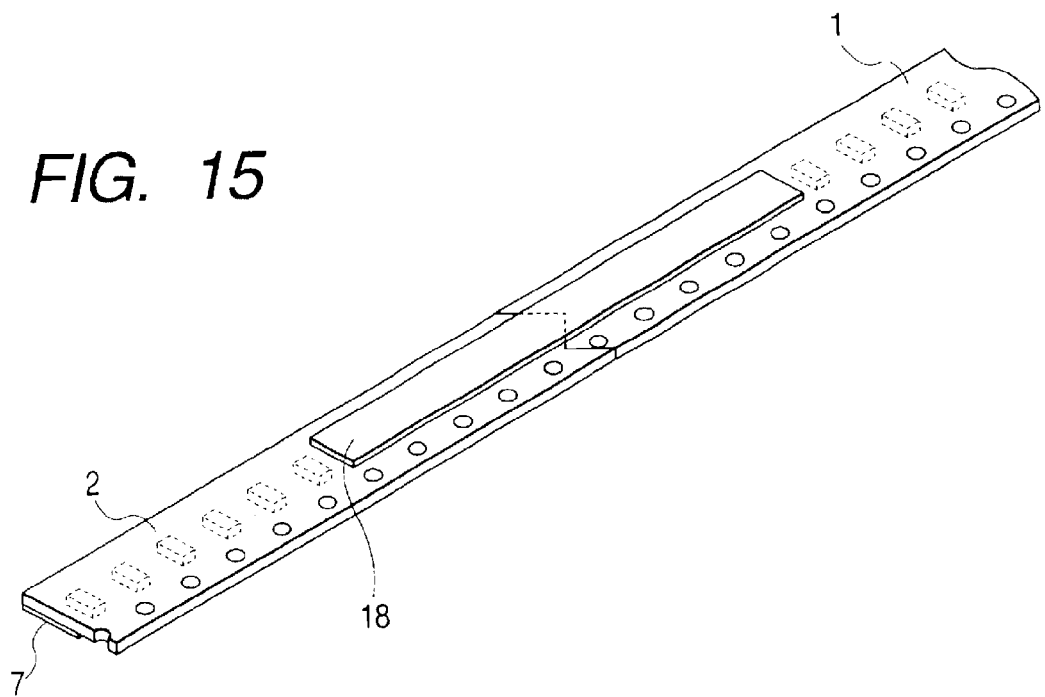
FIG. 15 is a perspective view showing the connecting member in another succeeding stage of the carrier tape connecting method in accordance with the preferable embodiment of the present invention.
Figure 16:
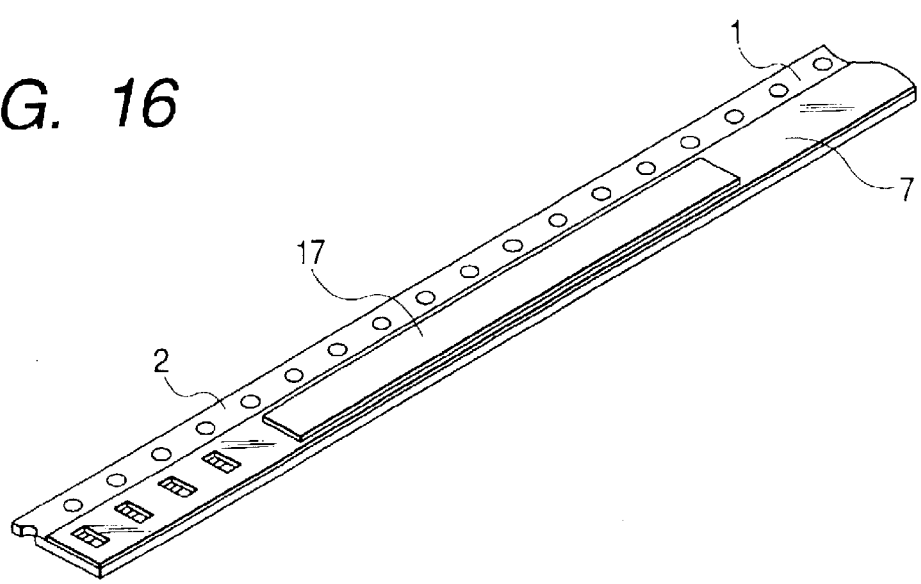
FIG. 16 is a perspective view showing the connecting member in another succeeding stage of the carrier tape connecting method in accordance with the preferable embodiment of the present invention.

Next, the worker folds the base film 15 along the folding line 20 as shown in FIG. 12. The upper surface of the second bonding tape 18 is brought into contact with the upper surfaces of the first and second carrier tapes 1 and 2 which are opposed to the surfaces covered by the top tape 7, as shown in FIG. 13. Then, the worker depresses the folded base film 15 by fingers so that the first and second bonding tapes 17 and 18 firmly adhere on the first and second carrier tapes 1 and 2. As described above, the connection of first and second bonding tapes 17 and 18 to the base film 15 is maintained by the weak adhesive layer coated on the surface of base film 15. Then, the worker releases the depression force from the base film 15 and peels the base film 15 off the second bonding tape 18 until the half of the base film 15 opens back along the folding line 20, as shown in FIG. 14. In this condition, the second bonding tape 18 remains on the first and second carrier tapes 1 and 2. Subsequently, the worker pulls the base film 15 downward to peel the remaining half of the base film 15 off the first bonding tape 17 located on the bottom the first and second carrier tapes 1 and 2. Thus, the base film 15 is completely removed from the first and second carrier tapes 1 and 2, leaving an assembly of the first and second carrier tapes 1 and 2 serially connected by means of the second bonding tape 18 adhered on one surface thereof as shown in FIG. 15 as well as by means of the first bonding tape 17 adhered on the opposite surface thereof via the top tape 7 as shown in FIG. 16.

In this manner, the trailing edge of first carrier tape 1 is adequately connected to the leading edge of second carrier tape 2. The first bonding tape 17 is adhered on the upper surface of the first and second carrier tapes 1 and 2 via the top tape 7, while the second bonding tape 18 is adhered on the lower surface of the first and second carrier tapes 1 and 2. This arrangement ensures the bonding strength of the joint portion between the first and second carrier tapes 1 and 2, thereby realizing reliable connection between the first and second carrier tapes 1 and 2.

Furthermore, after completing the positioning of first and second carrier tapes 1 and 2, the worker commences the connecting operation of first and second carrier tapes 1 and 2 from one side (i.e., upper surface) where the top tape 7 is provided. Thus, the connection of top tape 7 can be accurately performed. After accomplishing the connecting operation of first and second carrier tapes 1 and 2, the parts on the serially connected first and second carrier tapes 1 and 2 are conveyed to the parts mounting apparatus. During the parts mounting operation, the top tape 7 located at the connecting portion can be continuously and smoothly peeled off. Thus, this embodiment can stabilize the parts feeding operation for the parts mounting apparatus.

The second bonding tape 18 can be omitted if the first bonding tape 17 by alone can assure a strong bonding strength for the top tape 7 and the first and second carrier tapes 1 and 2 and when the first bonding tape 17 can assure a stable peeling operation of top tape 7.

Furthermore, as described above, the connecting operation of the first and second carrier tapes 1 and 2 is performed under the condition where their feed holes 8 completely agree with each other at the connecting portion. This assures that the first and second carrier tapes 1 and 2 can smoothly advance when their connecting portion passes in the parts mounting apparatus.

As described above, the first and second carrier tapes 1 and 2 are integrated at their upper and lower surfaces by means of the bonding tapes 17 and 18 adhered thereon. Hereinafter, the connecting member 14 will be explained in more detail. The reference band 16 shown in FIGS. 5 to 8 has a color different from that of the base film 15. More specifically, the base film 15 is transparent, while the color of reference band 16 is selected from black, red, blue, yellow, green, white, or the like. Using the colored reference band 16 is effective to highlight or emphasize the reference band 16 in contrast with the transparent base film 15. Hence, the worker can easily accomplish the positioning operation of first and second carrier tapes 1 and 2 by simply aligning the first and second carrier tapes 1 and 2 along the straight reference face 16a of reference band 16. The connecting operation of first and second carrier tapes 1 and 2 can be easily accomplished.

Furthermore, using the transparent base film 15 allows the worker to visually confirm the connecting condition between the leading edge of second carrier tape 2 and the trailing edge of first carrier tape 1 or visually confirm the bonding condition between the bonding tapes 17 and 18 and the carrier tapes. Thus, the worker can surely and correctly connect the first carrier tape 1 and the second carrier tape 2.

Furthermore, according to the above-described embodiment, the bonding tapes 17 and 18 are differentiated by color (e.g., blue) from the first and second carrier tapes 1 and 2 or its top tape 7. Thus, it is easy to identify the connecting portion of the carrier tapes 1 and 2 after they are connected.

It is also preferable that the bonding tapes 17 and 18 are transparent. The worker can surely confirm the presence of any part 6 remaining in the carrying hole 5 at the connecting portion after the carrier tapes 1 and 2 are connected.

Furthermore, it is preferable that the bonding tapes 17 and 18 are semitransparent. The worker can easily identify the connecting portion of the first and second carrier tapes 1 and 2 and confirm the presence of any part 6 remaining in the carrying hole 5 at the connecting portion.

Furthermore, as shown in FIG. 16, the first bonding tape 17 (or the second bonding tape 18) has a transverse width narrower (for example, 90% or less) than that of the top tape 7 provided on the first and second carrier tapes 1 and 2. When the trailing edge of first carrier tape 1 is connected to the leading edge of second carrier tape 2, the first bonding tape 17 (or the second bonding tape 18) is not bonded to a region other than the top tape 7. Thus, the worker can smoothly peel off the top tape 7 when the parts 6 are fed to the part mounting apparatus.

In some cases, the first and second carrier tapes 1 and 2 may be deformed in a zigzag fashion with respect to its longitudinal axis. According to JISC0806 "Taping of Electronic parts (surface mounting parts)", such a deformation must be suppressed within 1 mm per the length 100 mm. Hence, restricting the transverse width of the first bonding tape 17 (or the second bonding tape 18) to be 90% or less makes it possible to surely prevent the first bonding tape 17 (or the second bonding tape 18) from adhering on a region other than the top tape 7.

Figure 8:
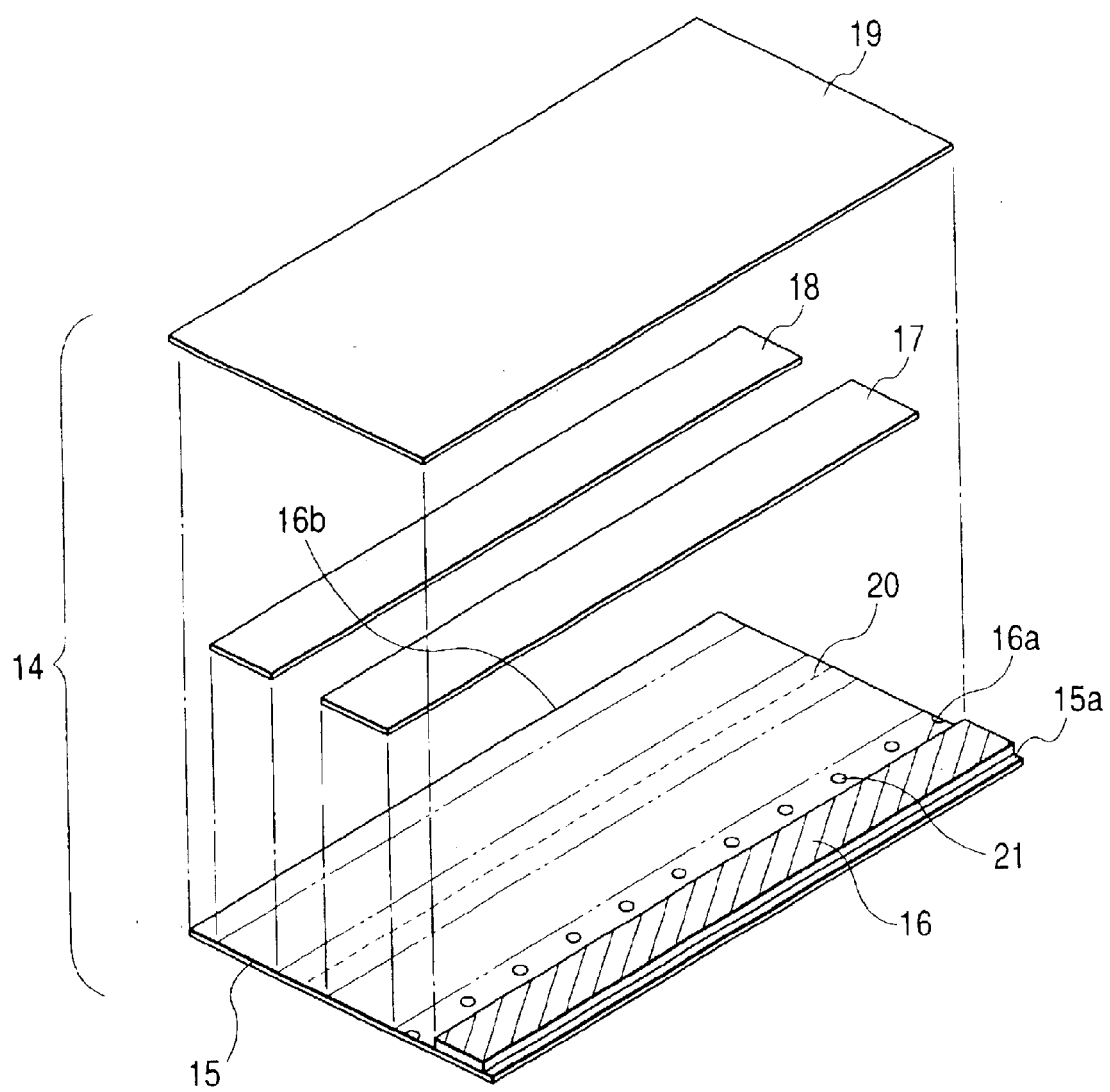
FIG. 8 is an exploded perspective view showing the connecting member in accordance with the preferable embodiment of the present invention.

Furthermore, as shown in FIG. 8, a predetermined gap 15a is provided between the reference band 16 and one longitudinal side of the base film 15. When the reference band 16 is bonded on the upper surface of base film 15 by adhesive, the gap 15a gives a marginal space for allowing the excessive adhesive to leak from the underneath of reference band 16 without overflowing the base film. Thus, the worker can apply a sufficient amount of adhesive onto the designated surface area of base film 15 beforehand without hesitating failure in application of adhesive. Bonding of the reference band 16 to the base film 5 can be ensured.

The distance from the folding line 20 to the reference face 16a of reference band 16 is longer than the distance from the folding line 20 to the opposite side 16b of base film 15. This arrangement further improves the workability by the following reason. When the base film 15 is folded along the folding line 20 as shown in FIG. 13, the opposite side 16b of base film 15 does not reach the reference face 16a. In other words, the folded part of base film 15 does not overlap with the reference band 16. The worker can firmly depress the first and second bonding tapes 17 and 18 to the first and second carrier tapes 1 and 2 from both of the upper and lower sides, thereby ensuring the bonding of the first and second bonding tapes 17 and 18 to the first and second carrier tapes 1 and 2. To adequately accomplish this operation, it is preferable that the base film 15 is transparent.

As shown in FIGS. 4 and 11, the trailing edge of first carrier tape 1 and the leading edge of second carrier tape 2 are cut into the wavy shape. The worker is only required to simply couple the leading edge of second carrier tape 2 with the trailing edge of first carrier tape 1 along the wavy cut faces. This makes it possible to correctly adjust the position of the leading edge of second carrier tape 2 with respect to the trailing edge of first carrier tape 1 without causing any dislocation in the transverse direction. As shown in FIG. 10, an edge mark 15b is provided at a longitudinal center of the base film 15 to indicate a portion corresponding to the wavy cut faces of the carrier tapes. The worker can easily perform the connecting operation of the first and second carrier tapes 1 and 2 with reference to this edge mark 15b. Namely, the worker connects the first and second carrier tapes 1 and 2 at the longitudinal center of the base film 15. Each of first and second bonding tapes 17 and 18 can span the first and second carrier tapes 1 and 2 symmetrically. The connection of these two carrier tapes is improved and stable. The connecting operation can be performed adequately.

Figure 7:
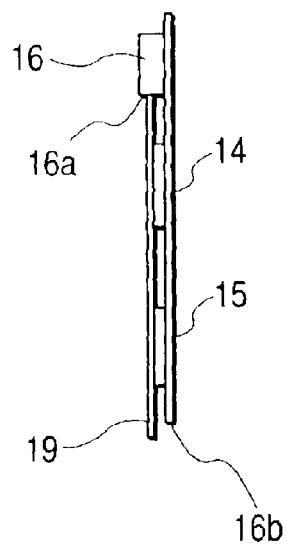
FIG. 7 is a side view showing the connecting member in accordance with the preferable embodiment of the present invention.

Furthermore, as shown in FIGS. 7 and 8, the cover film 19 overhangs from the opposite side 16b of base film 15. This allows the worker to pick the protruding edge of the cover film 19 so that the cover film 19 can be easily peeled off the base film 15.

Furthermore, as shown in FIG. 7, the reference band 16 is thicker than the cover film 19. This allows the worker to easily recognize the position of reference band 16 when the worker holds the connecting member 14. The worker grips the reference band 16 and peels off the cover film 19. The workability can be improved.

The connecting member 14 of the above-described embodiment, as shown in FIG. 8, has a rectangular shape of 26 mm×40 mm. All of the reference band 16, the base film 15, the first and second bonding tapes 17 and 18, and the cover film 19 have the same longitudinal length. This facilitates the manufacturing of connecting members because each connecting member 14 can be easily obtained by cutting band-like united materials at predetermined intervals.

Furthermore, it is preferable that the longitudinal size of connecting member 14 is in the range from 20 mm to 80 mm. Especially, the base film 15 having a longitudinal size not shorter than 20 mm is definitely necessary for the worker to hold the base film 15 and first and second carrier tapes 1 and 2 firmly by right and left hands. Workability in connecting two carrier tapes 1 and 2 can be improved.

Furthermore, restricting a longitudinal size of bonding tapes 17 and 18 is effective to facilitate the connecting operation. If the length of boding tapes 17 and 18 is excessively long, the worker will feel difficulty in correctly connecting the terminal edge of first carrier tape 1 to the leading edge of second carrier tape 2. However, 80 mm or less is an adequate length for the worker to hold two carrier tapes straight at the connecting portion during the connecting operation. The connecting operation can be stabilized.

In the foregoing description, the cutting tool 9 is explained as having two wavy cutting blades 10 and 11 to cut the first and second carrier tapes 1 and 2. However, it is also possible to use another cutting tool with a pair of concave and convex cutting blades. This will also improve the wokability in cutting the trailing edge of first carrier tape 1 and the leading edge of second carrier tape 2 without causing any dislocation in the transverse direction.

When the first and second carrier tapes 1 and 2 are cut at their edges, the top tape 7 is cut into a single wavy shape as shown in FIG. 4. More specifically, a downstream top tape 7 positioned on the leading edge of second carrier tape 2 is cut into a single mount shape while an upstream top tape 7 positioned on the trailing edge of first carrier tape 1 is cut into a single valley shape. The cut edge of downstream top tape 7 has a pinnacle protruding at its center toward the upstream side and is just engageable with the cut edge of upstream top tape 7. It is also possible to configure the downstream top tape 7 positioned on the leading edge of second carrier tape 2 into a single convex shape protruding toward the upstream side. In this case, it is preferable that a pinnacle of the convex shape is positioned at the center of the top tape 7.

In this manner, the cut shape of the top tape 7 is configured into a single convex or mount shape at the connecting portion of the first and second carrier tapes 1 and 2. This is effective to prevent the cut edge of top tape 7 from being winkled or broken due to its thinness when the top tape 7 is made of a polyester having the thickness of 50 $\mu$m to 80 $\mu$m. The connection between first and second carrier tapes becomes stable.

Furthermore, configuring the cut shape of the downstream top tape 7 into a convex or mount shape protruding toward the upstream top tape 7 is helpful for the worker to peel off the upstream and downstream top tapes 7 serially connected by means of the first bonding tape 17 (or the second bonding tape 18) at the connecting portion during the mounting operation.

Furthermore, providing the pinnacle of a convex or mount cut face at the center of the downstream top tape 7 is helpful for the worker to peel-off the top tape 7 on the second carrier tape 2 smoothly.

Figure 17:
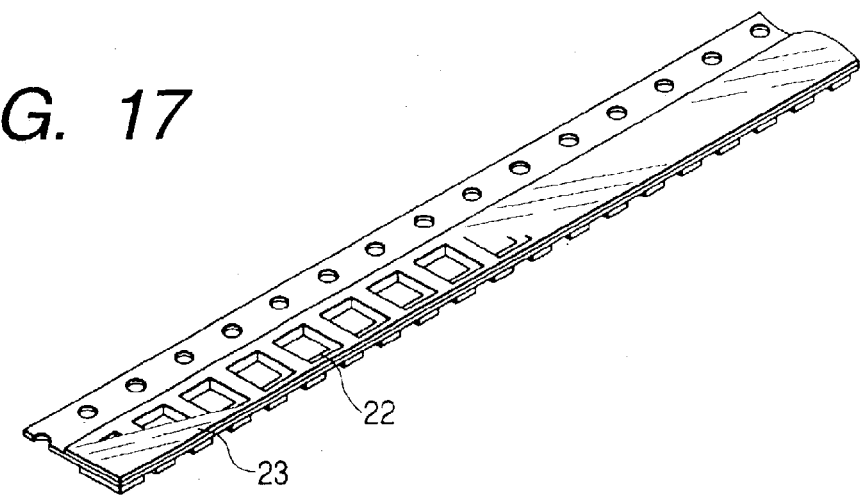
FIG. 17 is a perspective view showing an emboss type carrier tape in accordance with the preferable embodiment of the present invention.
Figure 18:
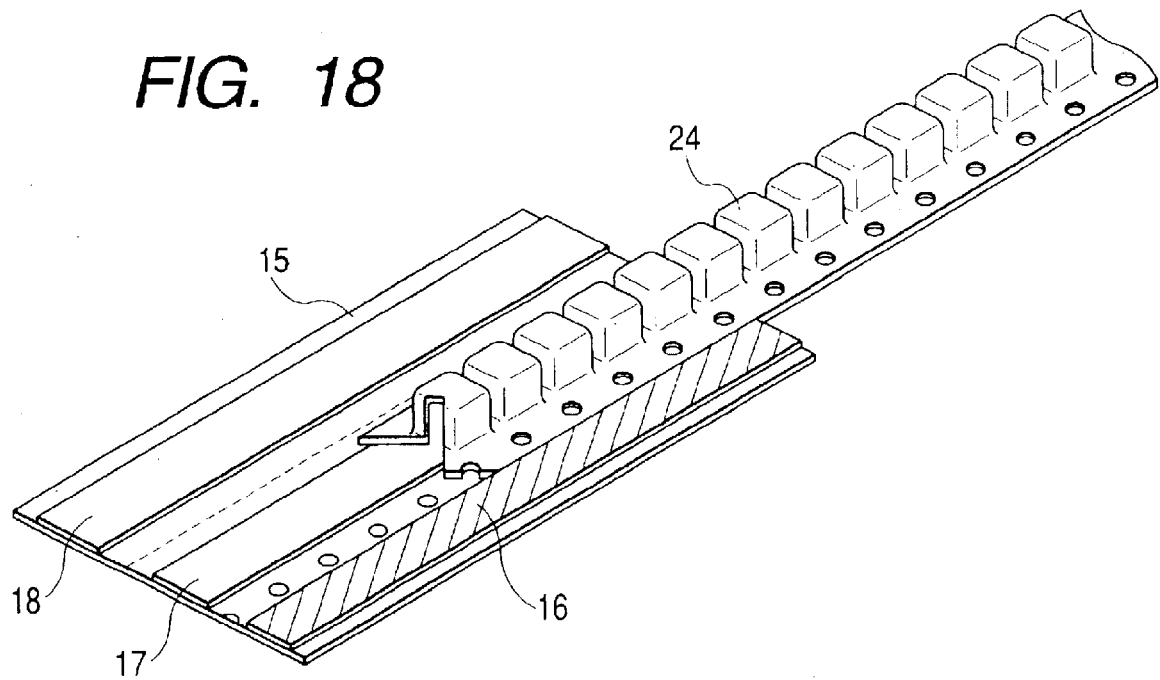
FIG. 18 is a perspective view showing the connecting member in one stage of a carrier tape connecting method for connecting the carrier tape shown in FIG. 17 in accordance with the preferable embodiment of the present invention.

It is also possible to modify the first and second carrier tapes 1 and 2 so as to have deeply embossed carrying holes 22 as shown in FIG. 17. In this case, the upper surface of first carrier tape 1 covered by a top tape 23 is faced down on the first bonding tape 17 as shown in FIG. 18. When the base film 15 is folded, the second bonding tape 18 adheres on an embossed bottom portion 24. Although the bonding strength of the second bonding tape 18 may be weakened due to the deeply deformed shape of embossed bottom portion 24, the first bonding tape 17 give a sufficient bonding strength.

Figure 19:
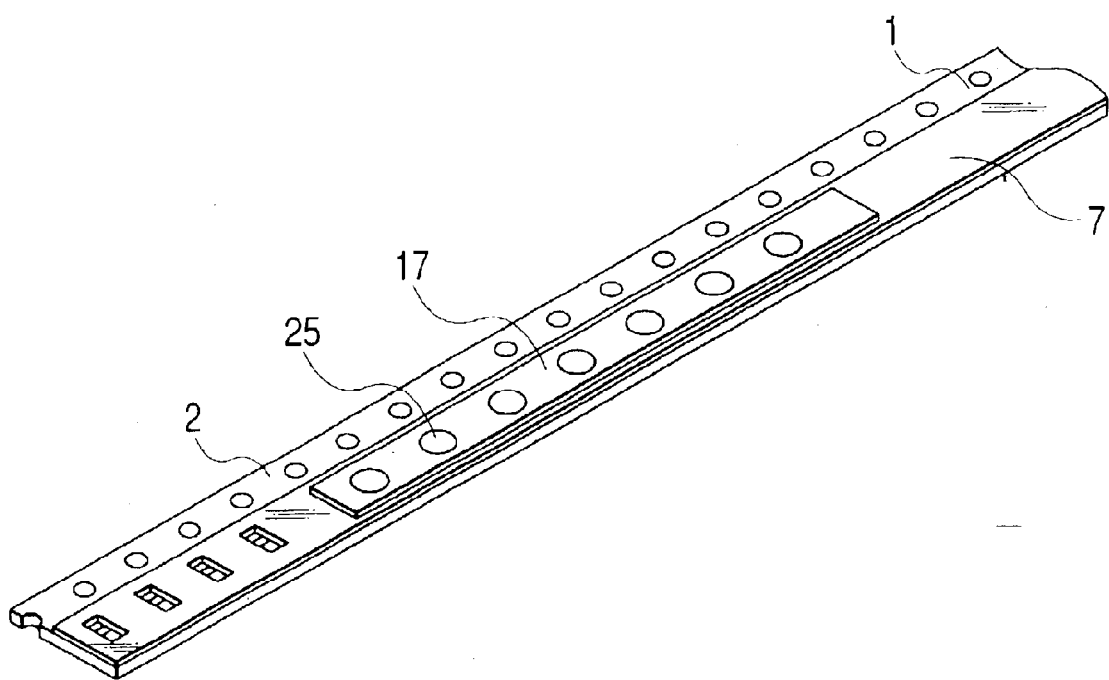
FIG. 19 is a perspective view showing a modified connecting member in accordance with the preferable embodiment of the present invention.

Furthermore, as shown in FIG. 19, it is preferable to provide identification marks 25 on the surface of first bonding tape 17 (or the second bonding tape 18). The identification marks 25, arrayed in the longitudinal direction of the bonding tape, is detectable by an appropriate sensor equipped in the parts mounting apparatus. Thus, the worker can easily find the connecting portion. The number or color of identification marks 25 can changed to add various information. For example, the identification marks 25 can be used as a sign or partition for changing the kind of parts 6 carried on the carrier tape.

The shape of each identification mark 25 is not limited to a round one, and therefore can be changed to other shape, such as a rectangle one, a triangular one, or a bar code. It is also possible to change the lower or shape of the first bonding tape 17 (or the second bonding tape 18) so that the bonding tape can be used as a sort of identification mark.

As described above, the present invention provides a connecting member used for serially connecting two carrier tapes, comprising a base film, a belt-like reference band substantially fixed on the base film, a bonding tape adhering on the base film, and a cover film covering the bonding tape, wherein a straight reference face is provided on a longitudinal side of the reference band closely to the bonding tape. According to the connecting member of this invention, a worker can align a first carrier tape and a second carrier tape serially along the reference face of the reference band, and connects leading and trailing edges of the first and second carrier tapes with the bonding tape. Thus, it becomes possible to easily perform the connecting operation without causing any dislocation or inclination between the first and second carrier tapes.

What is claimed is:

1. A method for serially connecting two carrier tapes with a connecting member, said connecting member comprising:

a base film;

a belt-like reference band substantially fixed on said base film;

a bonding tape adhering on said base film; and a cover film covering said bonding tape, wherein a straight reference face is provided on a longitudinal side of said reference band closely to said bonding tape, and said method comprising the steps of:

peeling the cover film off said base film;

positioning an edge portion of a first carrier tape on said base film in such a manner that said first carrier tape is brought into contact with said reference band along the reference face;

bonding the edge portion of said first carrier tape to the bonding tape;

positioning an edge portion of a second carrier tape on said base film in such a manner that said second carrier tape is brought into contact with said reference band along the reference face and is also brought into contact with said first carrier tape along their edge portions;

bonding the edge portion of said second carrier tape to the bonding tape; and removing an assembly of said first and second carrier tapes serially connected by said bonding tape from said base film.

2. The carrier tape connecting method in accordance with claim 1, wherein each of said first and second carrier tapes has a plurality of carrying holes for accommodating parts and a top tape covering said carrying holes and the edge portions of said first and second carrier tapes are connected to said bonding tape via said top tape.

3. The carrier tape connecting method in accordance with claim 1, further comprising the step of cutting the edge portions of said first and second carrier tapes into convex and concave shapes just fitting to each other, before said edge portions of said first and second carrier tapes are connected with said connecting member.

4. The carrier tape connecting method in accordance with claim 1, further comprising the step of cutting the edge portions of said first and second carrier tapes into wavy shapes just fitting to each other, before said edge portions of said first and second carrier tapes are connected with said connecting member.

5. The carrier tape connecting method in accordance with claim 3, wherein the edge portions of said first and second carrier tapes are cut with a cutting tool having cutting blades corresponding to said convex and concave shapes.

6. The carrier tape connecting method in accordance with claim 5, wherein positioning pins, engageable with said feed holes of said carrier tapes, are provided on one cutting blade of said cutting tool.

7. The carrier tape connecting method in accordance with claim 6, wherein each of said first and second carrier tapes has a plurality of carrying holes for accommodating parts and a top tape covering said carrying holes, and said top tape is cut into convex and concave shapes or into wavy shapes at the edge portions of said carrier tapes.

8. The carrier tape connecting method in accordance with claim 7, wherein the top tape provided on a leading edge of a downstream carrier tape is cut into a convex shape protruding toward a trailing edge of an upstream carrier tape.

9. The carrier tape connecting method in accordance with claim 8, wherein said convex shape has a pinnacle at substantially the center of said top tape provided on the leading edge of the downstream carrier tape.

10. A method for serially connecting two carrier tapes with a connecting member, said connecting member comprising:

a base film;

a belt-like reference band substantially fixed on said base film;

a bonding tape adhering on said base film; and a cover film covering said bonding tape, wherein a straight reference face is provided on a longitudinal side of said reference band closely to said bonding tape, a plurality of feed hole marks are provided between said reference band and said bonding tape on said base film, and said feed hole marks are arrayed at predetermined intervals so as to agree with feed holes of each carrier tape, said method comprising the stops of:

peeling the cover film off said base film;

positioning an edge portion of a first carrier tape on said base film in such a manner that said first carrier tape is brought into contact with said reference band along the reference face and also the position of feed holes of said first carrier tape agrees with the feed hole marks of said base film;

bonding the edge portion of said first carrier tape to the bonding tape;

positioning an edge portion of a second carrier tape on said base film in such a manner that said second carrier tape is brought into contact with said reference band along the reference face and is also brought into contact with said first carrier tape along their edge portions;

bonding the edge portion of said second carrier tape to the bonding tape; and removing an assembly of said first and second carrier tapes serially connected by said bonding tape from said base film.

11. A method for serially connecting two carrier tapes with a connecting member, said connecting member comprising:

a base film;

a belt-like reference band substantially fixed on said base film;

a bonding tape adhering on said base film; and a cover film covering said bonding tape, wherein a straight reference face is provided on a longitudinal side of said reference band closely to said banding tape, and an edge mark is provided at a longitudinal center of said base film to indicate a portion corresponding to a cut face of each carrier tape, said method comprising the steps of:

peeling the cover film off said base film;

positioning an edge portion of a first carrier tape on said base film in such a manner that said first carrier tape is brought into contact with said reference band along the reference face and also the position of said edge portion of said first carrier tape agrees with said edge mark of said base film;

bonding the edge portion of said first carrier tape to the bonding tape;

positioning an edge portion of a second carrier tape on said base film in such a manner that said second carrier tape is brought into contact with said reference band along the reference face and is also brought into contact with said first carrier tape along their edge portions;

bonding the edge portion of said second carrier tape to the bonding tape; and removing an assembly of said first and second carrier tapes serially connected by said bonding tape from said base film.

12. A method for serially connecting two carrier tapes with a connecting member, said connecting member comprising:

a base film;

a belt-like reference band substantially fixed on said base film;

first and second bonding tapes adhering on said base film; and a cover film covering said first and second bonding tapes, wherein a straight reference face is provided on a longitudinal side of said reference band closely to said bonding tapes, a folding line is provided between said first and second bonding tapes on said base film, and said folding line is parallel to said reference face of said reference band, said method comprising the steps of:

peeling the cover film off said base film;

positioning an edge portion of a first carrier tape on said base film in such a manner that said first carrier tape is brought into contact with said reference band along the reference face;

bonding one surface of the edge portion of said first carrier tape to the first bonding tape located between said folding line and said reference band;

positioning an edge portion of a second carrier tape on said base film in such a manner that said second carrier tape is brought into contact with said reference band along the reference face and is also brought into contact with said first carrier tape along their edge portions;

bonding one surface of the edge portion of said second carrier tape to said first bonding tape;

folding said base film along said folding line so that the second bonding tape located between said folding line and the other end of said base film is adhered on opposite surfaces of the edge portions of said first and second carrier tapes; and removing an assembly of said first and second carrier tapes serially connected by said first and second bonding tapes from said base film.

13. The carrier tape connecting method in accordance with claim 12, wherein each of said first and second carrier tapes has a plurality of carrying holes for accommodating parts and a top tape covering said carrying holes, and the edge portions of said first and second carrier tapes are first connected to said first bonding tape via said top tape and then connected to said second bonding tape.

* * * * *

UNITED STATES PATENT AND TRADEMARK OFFICE
CERTIFICATE OF CORRECTION

PATENT NO. : 6,916,394 B2
DATED : July 12, 2005
INVENTOR(S) : Hiroto Sumida et al.

It is certified that error appears in the above-identified patent and that said Letters Patent is hereby corrected as shown below:

Title page,
Item [54], Title, "CONNECTING MEMBER FOR CONNECTING CARRIER TAPES AND CARRIER TAPE CONNECTING METHOD USING THIS CONNECTING" should read -- CONNECTING MEMBER FOR CONNECTING CARRIER TAPES AND CARRIER TAPE CONNECTING METHOD USING THIS CONNECTING MEMBER --.

Column 16,
Line 20, "stops" should read -- steps --;
Line 53, "banding" should read -- bonding --.

Signed and Sealed this

Thirtieth Day of August, 2005

JON W. DUDAS
*Director of the United States Patent and Trademark Office*